US010868049B2

(12) United States Patent
Park et al.

(10) Patent No.: US 10,868,049 B2
(45) Date of Patent: Dec. 15, 2020

(54) DISPLAY DEVICE AND MANUFACTURING METHOD THEREOF

(71) Applicant: Samsung Display Co., Ltd., Yongin-si (KR)

(72) Inventors: Joon Seok Park, Yongin-si (KR); Tae Sang Kim, Seoul (KR); Yeon Keon Moon, Hwaseong-si (KR); Geun Chul Park, Suwon-si (KR); Jun Hyung Lim, Seoul (KR); Kyung Jin Jeon, Incheon (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/529,516

(22) Filed: Aug. 1, 2019

(65) Prior Publication Data
US 2020/0075641 A1 Mar. 5, 2020

(30) Foreign Application Priority Data

Sep. 4, 2018 (KR) .................... 10-2018-0105501

(51) Int. Cl.
*H01L 29/04* (2006.01)
*H01L 33/00* (2010.01)
(Continued)

(52) U.S. Cl.
CPC .......... *H01L 27/1251* (2013.01); *G09G 3/32* (2013.01); *H01L 21/02384* (2013.01);
(Continued)

(58) Field of Classification Search
CPC ............... H01L 27/1251; H01L 27/156; H01L 29/78645; H01L 29/8124; H01L 21/02384;
(Continued)

(56) References Cited

U.S. PATENT DOCUMENTS 8,628,987 B2   1/2014 Yamazaki
9,455,279 B2 *  9/2016 Cho ...................... G02F 1/1362
(Continued)

FOREIGN PATENT DOCUMENTS

KR   10-2015-0030518 A   3/2015
KR   10-2016-0001851 A   1/2016
(Continued)

OTHER PUBLICATIONS

Rongsheng Chen, Wei Zhou, Meng Zhang, Man Wong, Hoi Sing Kwok, "Self-aligned top-gate InGaZnO thin film transistors using SiO2/Al2O3 stack gate dielectric", Thin Solid Films 548 (2013), Sep. 17, 2013, 4 pages (572-575), 2013 Elsevier B.V., Theme-Based Research Scheme T23-713/11-1.

Primary Examiner — Alonzo Chambliss
(74) Attorney, Agent, or Firm — Innovation Counsel LLP

(57) ABSTRACT

A display device includes: a substrate including a display area and a non-display area; a gate driver disposed on the substrate in the non-display area and including a plurality of stages that generate a gate signal and output the gate signal to the display area; a switching transistor and a driving transistor disposed on the substrate in the display area; and a light emitting diode connected to the driving transistor, wherein each of the plurality of stages may include a plurality of transistors, wherein a channel layer of the driving transistor includes a first oxide semiconductor material, and a channel layer of the plurality of transistors included in each of the plurality of stages includes a second oxide semiconductor material, wherein the first oxide semiconductor material is different from the second oxide semiconductor material, and wherein the second oxide semiconductor material may include tin.

20 Claims, 14 Drawing Sheets

(51) Int. Cl.

| | | |
|---|---|---|
| *H01L 31/062* | (2012.01) | |
| *H01L 21/00* | (2006.01) | |
| *H01L 21/82* | (2006.01) | |
| *H01L 21/336* | (2006.01) | |
| *H01L 27/12* | (2006.01) | |
| *G09G 3/32* | (2016.01) | |
| *H01L 27/15* | (2006.01) | |
| *H01L 29/10* | (2006.01) | |
| *H01L 29/786* | (2006.01) | |
| *H01L 21/02* | (2006.01) | |
| *H01L 51/05* | (2006.01) | |
| *H01L 29/812* | (2006.01) | |

(52) U.S. Cl.
CPC ...... *H01L 21/02452* (2013.01); *H01L 27/156* (2013.01); *H01L 29/1025* (2013.01); *H01L 29/78645* (2013.01); *H01L 29/8124* (2013.01); *H01L 51/0558* (2013.01); *G09G 2310/0264* (2013.01)

(58) Field of Classification Search
CPC ........... H01L 21/02452; H01L 51/0558; H01L 29/1025; G09G 3/32
See application file for complete search history.

(56) References Cited

U.S. PATENT DOCUMENTS

| | | | |
|---|---|---|---|
| 10,020,461 B2* | 7/2018 | Park | H01L 51/5044 |
| 10,439,161 B2* | 10/2019 | Park | H01L 51/56 |
| 10,497,760 B2* | 12/2019 | Yeo | H01L 27/3258 |
| 2015/0243220 A1* | 8/2015 | Kim | H01L 27/1222 345/215 |
| 2018/0033847 A1* | 2/2018 | Kim | H01L 27/1255 |
| 2018/0175127 A1* | 6/2018 | Lee | H01L 27/1248 |
| 2018/0284551 A1* | 10/2018 | Shim | G09G 3/3677 |

FOREIGN PATENT DOCUMENTS

| | | |
|---|---|---|
| KR | 10-1785688 B1 | 10/2017 |
| KR | 10-2017-0126535 A | 11/2017 |

\* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2018-0105501 filed in the Korean Intellectual Property Office on Sep. 4, 2018, the disclosure of which is incorporated herein by reference in its entirety.

BACKGROUND (a) Technical Field

The present disclosure relates to a display device and a manufacturing method thereof.

(b) Description of the Related Art

A display device such as a light emitting display device includes a display panel on which an image is displayed, and a driver such as a gate driver and a data driver for driving the display panel. The driver may be provided as a separate chip and electrically connected to the display panel in a fabrication process. Recently, a technique of integrating the gate driver in the display panel without providing the gate driver as a separate chip has been developed.

As a resolution of the display device increases, resistances of transistors of stages included in the gate driver and switching transistors of the display device also increase. Thus, in a high-resolution display device, such transistors may be formed to have a channel layer including an oxide semiconductor material of high mobility to reduce their size.

However, when the oxide semiconductor material of high mobility is applied to the channel layer of driving transistors of the display device, a driving range of the driving transistor may be compromised.

The above information disclosed in this Background section is only for enhancement of understanding of the background of the present disclosure, and it may contain information that does not form the prior art that is already known to a person of ordinary skill in the art.

SUMMARY

The present disclosure provides a display device in which a channel layer of a transistor of a gate driver and a channel layer of a driving transistor include different materials.

In addition, the present disclosure provides a method of forming a channel layer of a transistor of a gate driver and a channel layer of a driving transistor including different materials, by a single masking process.

An exemplary embodiment of the present disclosure provides a display device including: a substrate including a display area and a non-display area; a gate driver disposed on the substrate in the non-display area and including a plurality of stages that generate a gate signal and output the gate signal to the display area; a switching transistor and a driving transistor disposed on the substrate in the display area; and a light emitting diode connected to the driving transistor, wherein each of the plurality of stages may include a plurality of transistors, a channel layer of the driving transistor include a first oxide semiconductor material, and a channel layer of the plurality of transistors included in each of the plurality of stages includes a second oxide semiconductor material, wherein the first oxide semiconductor material is different from the second oxide semiconductor material, and the second oxide semiconductor material may include tin.

The channel layer of the switching transistor may include the second oxide semiconductor material.

The channel layer of the plurality of transistors included in each of the plurality of stages and the channel layer of the driving transistor may be disposed on different layers.

The channel layer of the switching transistor and the channel layer of the plurality of transistors included in each of the plurality of stages may be disposed on the same layer.

Each of the transistors included in the stage and the switching transistor may include: a switching semiconductor layer disposed on the substrate and including a switching source region, a switching drain region, and a switching intermediate region disposed between the switching source region and the switching drain region; a switching channel layer disposed on the switching semiconductor layer; a gate insulating film disposed on the switching channel layer; a switching gate electrode disposed on the gate insulating film and overlapping at least a portion of the switching channel layer; a switching source electrode connected to the switching source region; and a switching drain electrode connected to the switching drain region, and the switching channel layer may overlap at least a portion of the switching intermediate region of the switching semiconductor layer.

Each of the channel layer of the plurality of transistors included in each of the plurality of stages and the channel layer of the switching transistor may include the switching channel layer.

The driving transistor may include: a driving semiconductor layer disposed on the substrate and including a driving source region, a driving drain region, and a driving intermediate region disposed between the driving source region and the driving drain region; the gate insulating film disposed on the driving channel layer; a driving gate electrode disposed on the gate insulating film and overlapping at least a portion of the driving channel layer; a driving source electrode connected to the driving source region; and a driving drain electrode connected to the driving drain region.

The channel layer of the driving transistor may include the driving intermediate region.

The switching intermediate region and the driving intermediate region may include a same material.

Another exemplary embodiment of the present disclosure provides a method of manufacturing a display device, wherein the display device may include a substrate including a display area and a non-display area, a gate driver disposed on the substrate in the non-display area and including a plurality of stages that generate a gate signal and output the gate signal to the display area, a switching transistor and a driving transistor disposed on the substrate in the display area, and a light emitting diode connected to the driving transistor, wherein the method may include: sequentially forming a first semiconductor material layer and a second semiconductor material layer on the substrate; forming a switching semiconductor layer and a driving semiconductor layer by etching the first semiconductor material layer; forming a switching channel layer that overlaps at least a portion of the switching semiconductor layer by etching the second semiconductor material layer; forming a gate insulating film material layer on the substrate, the switching semiconductor layer, the driving semiconductor layer, and the switching channel layer; forming a switching gate electrode that overlaps at least a portion of the switching channel layer and a driving gate electrode that overlaps at least a portion of the driving semiconductor layer on the gate insulating film material layer; forming a gate insulating film by etching the gate insulating film material layer using the switching gate electrode and the driving gate electrode as masks; forming an interlayer insulating film on the switching semiconductor layer, the driving semiconductor layer, the switching gate electrode, and the driving gate electrode; forming a switching source electrode, a switching drain electrode, a driving source electrode, and a driving drain electrode on the interlayer insulating film; and forming a light emitting diode connected to the driving drain electrode, wherein the first semiconductor material layer may include a first oxide semiconductor material, and the second semiconductor material layer may include a second oxide semiconductor material, wherein the first oxide semiconductor material is different from the second oxide semiconductor material, and wherein the second semiconductor material layer may include tin.

The forming of the switching semiconductor layer and the driving semiconductor layer and the forming of the switching channel layer may include: forming a first photoresist film on the second semiconductor material layer; forming a second photoresist film and a third photoresist film by exposing and developing the first photoresist film using a first mask; etching the first semiconductor material layer and the second semiconductor material layer by a first etching process; forming a fourth photoresist film by ashing the second photoresist film and the third photoresist film; etching the second semiconductor material layer by a second etch process; and removing the fourth photoresist film.

The first mask may include a light blocking region, a transmissive region, and a semi-transmissive region.

The first etching process may include etching the first semiconductor material layer and the second semiconductor material layer using the second photoresist film and the third photoresist film as masks, and the switching semiconductor layer and the driving semiconductor layer may be formed by etching the first semiconductor material layer.

In the forming of the fourth photoresist film, the third photoresist film may be removed and a portion of the second photoresist film may be removed.

In the second etching process, the second semiconductor material layer may be etched using the fourth photoresist film as a second mask to form the switching channel layer.

The forming of the interlayer insulating film may include performing heat treatment to diffuse hydrogen of the interlayer insulating film into the switching semiconductor layer and the driving semiconductor layer.

Each of the plurality of stages may include a plurality of transistors, and the plurality of transistors included in each of the plurality of stages and the switching transistor may have a same structure.

The switching transistor may include the switching semiconductor layer, the switching channel layer, the switch layer gate electrode, the switching source electrode, and the switching drain electrode, and the driving transistor may include the driving semiconductor layer, the driving gate electrode, the driving source electrode, and the driving drain electrode.

The channel layer of the switching transistor may include the switching channel layer.

The switching semiconductor layer may include a switching intermediate region that overlaps at least a portion of the switching channel layer, the driving semiconductor layer may include a driving intermediate region that overlaps at least a portion of the driving gate electrode, and the channel layer of the driving transistor may include the driving intermediate region.

According to the exemplary embodiment of the present disclosure, a channel layer of a transistor of a driver and a channel layer of a driving transistor may be different from each other.

In addition, according to the exemplary embodiment of the present disclosure, it is possible to form a channel layer of a transistor of a driver and a channel layer of a driving transistor having different materials, by a single masking process.

DETAILED DESCRIPTION OF THE EMBODIMENTS

Figure 1:
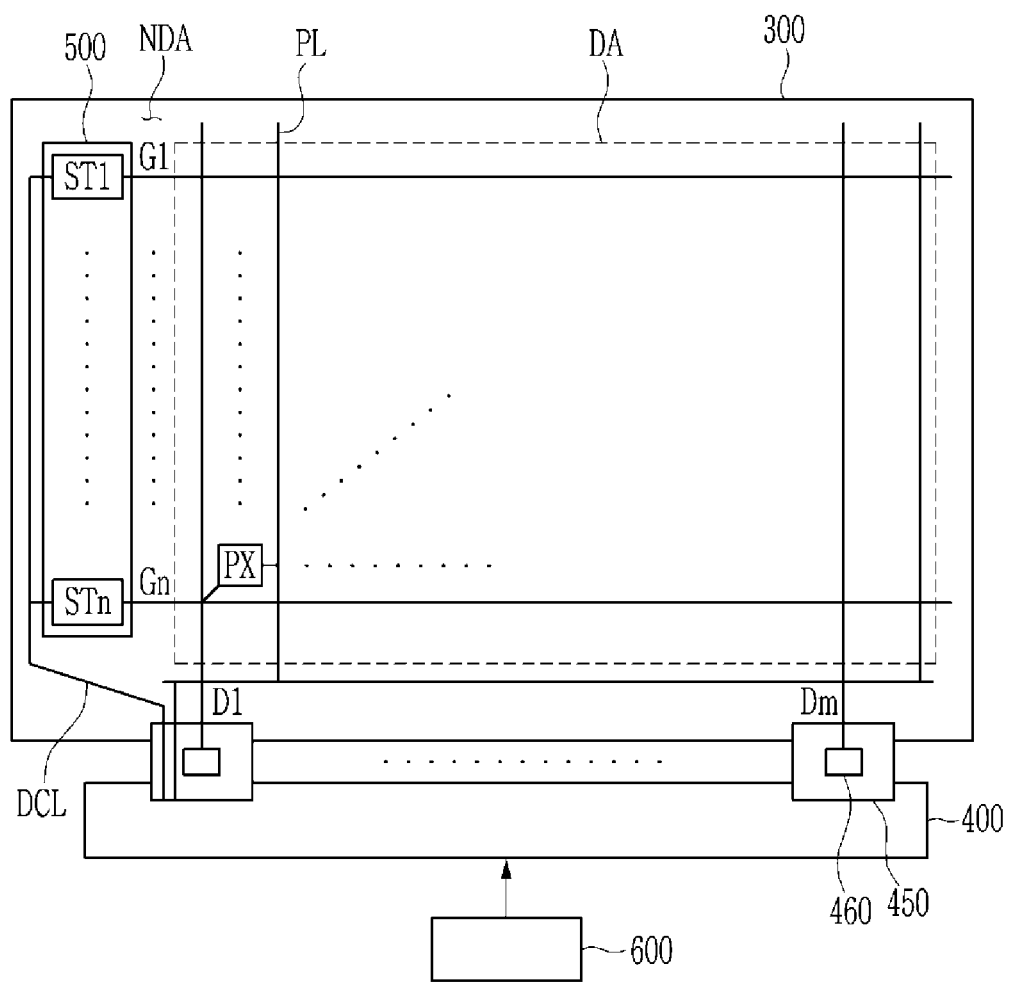
FIG. 1 schematically illustrates a display device according to an exemplary embodiment of the present disclosure.

The present disclosure will be described more fully hereinafter with reference to the accompanying drawings, in which exemplary embodiments of the present disclosure are shown. As those skilled in the art would realize, the described exemplary embodiments may be modified in variously different ways, without departing from the spirit or scope of the present disclosure.

Parts that are irrelevant to the description may be omitted for the clear description of the present disclosure, and like reference numerals designate like elements throughout the specification.

Further, in the drawings, the size and thickness of each element may be arbitrarily illustrated for ease of description, and the present disclosure is not necessarily limited to those illustrated in the drawings. In the drawings, the thicknesses of layers, films, panels, regions, etc., may be exaggerated for clarity. In the drawings, for ease of description, the thicknesses of some layers and areas may be particularly exaggerated.

It will be understood that when an element such as a layer, film, region, or substrate is referred to as being "on" another element, it can be directly on the other element or one or more intervening elements may also be present. In contrast, when an element is referred to as being "directly on" another element, there may be no intervening elements present. Further, in the specification, the word "on" or "above" means positioned on or below the object portion, and does not necessarily mean positioned on the upper or lower side of the object portion based on a gravitational direction.

In addition, unless explicitly described to the contrary, the word "comprise" and its variations such as "comprises" or "comprising" will be understood to imply the inclusion of stated elements but not the exclusion of any other elements.

Further, throughout the specification, the phrase "on a plane" or "in a plan view" means viewing a target portion from the top, and the phrase "on a cross-section" or "in a cross-sectional view" means viewing a cross-section formed by vertically cutting a target portion from a side.

FIG. 1 schematically illustrates a display device according to an exemplary embodiment of the present disclosure.

Referring to FIG. 1, the display device includes a display panel 300, a data driver 460, a gate driver 500, and a signal controller 600.

The display panel 300 includes a display area DA for displaying an image and a non-display area NDA around the display area DA. Various elements and wires that may receive signals from the outside to display an image are formed on the display panel 300, for example, a substrate.

A plurality of pixels PX for displaying an image, and a plurality of gate lines G1 to Gn and a plurality of data lines D1 to Dm for respectively applying signals to the pixels PX are disposed in the display area DA. The plurality of gate lines G1 to Gn and the plurality of data lines D1 to Dm may be insulated from each other and cross each other in a plan view. In addition, a plurality of driving voltage lines PL (e.g., driving voltage line 172 shown in FIG. 2) for applying driving voltages to the pixels PX are disposed in the display area DA.

Each pixel PX includes at least two transistors including a switching transistor and a driving transistor, at least one storage capacitor, and a light emitting element (e.g., a light emitting diode), and may further include at least one compensating transistor. The pixel PX will be described later in detail.

The gate driver 500 for applying a gate signal to the plurality of gate lines G1 to Gn is disposed in the non-display area NDA. The gate driver 500 may be integrated on the substrate in the non-display area NDA. Each of the plurality of data lines D1 to Dm in the display area DA may receive a data signal (that is, a data voltage applied to a pixel) from the data driver 460. In one embodiment, the data driver 460 may be an integrated circuit (IC) chip mounted on a flexible printed circuit board (FPCB) 450 bonded to the display panel 300.

The gate driver 500 and the data driver 460 are controlled by the signal controller 600. A printed circuit board (PCB) 400 located outside the FPCB 450 may transmit signals from the signal controller 600 to the data driver 460 and the gate driver 500. Signals provided from the signal controller 600 to the gate driver 500 may be transmitted to the gate driver 500 through a driver control signal line (DCL) disposed in the display panel 300. Those signal provided from the signal controller 600 to the gate driver 500 through the driver control signal line DCL may include a vertical start signal and a clock signal, and a signal for providing a low level of a specific level. Some signals may be provided from an external device (not shown) other than the signal controller 600.

For example, the driver control signal line DCL may be connected to the FPCB 450 that is disposed close to the gate driver 500, and may extend in a direction in which the gate driver 500 extends. The driver control signal line DCL may extend, for example, in parallel with the gate driver 500 in the non-display area NDA. Although the driver control signal line DCL is shown as a single line to simplify the drawing of FIG. 1, the driver control signal line DCL may include a number of signal lines corresponding to a type of the signal transmitted to the gate driver 500, or may include more or fewer signal lines. The signal lines of the driver control signal line DCL may be disposed in parallel with the gate driver 500 farther outside than the gate driver 500 from the display area DA, but the present disclosure is not limited thereto, and some signal lines of the driver control signal line DCL may be disposed through the gate driver 500.

The gate driver 500 may receive a vertical start signal, a clock signal, and a low voltage corresponding to a gate-off voltage through the driver control signal line DCL to generate gate signals (e.g., a gate-on voltage and a gate-off voltage), and then applies the gate signals to the plurality of gate lines G1 to Gn. The gate driver 500 may include a plurality of stages ST1 to STn for generating and outputting the gate signals. The plurality of stages ST1 to STn may be connected to the respective ones of the plurality of gate lines G1 to Gn, and the stages ST1 to STn may sequentially output gate signals to the plurality of gate lines G1 to Gn, respectively. However, the present disclosure is not limited thereto, and one stage of the plurality of stages ST1 to STn may be connected to two gate lines among the plurality of gate lines G1 to Gn. In this case, each stage may output a gate signal to the two gate lines. In other embodiments, three or more gate lines may be connected to one stage.

The gate driver 500 may be located on the left and/or right side of the display area DA, and alternatively may be located on the upper side and/or the lower side of the display area DA. When two gate drivers 500 are disposed on the left and right sides of the display panel 300, respectively, the first gate driver 500 disposed on the left side of the display panel 300 may include odd-numbered stages (ST1, ST3, . . . ) and the second gate driver 500 disposed on the right side of the display panel 300 may include even-numbered stages (ST2, ST4, . . . ), or vice versa. However, in some embodiments, even if the two gate drivers 500 are disposed on the left and right sides of the display panel 300, respectively, each of the two gate drivers 500 may include all stages ST1 to STn.

Each of the stages ST1 to STn may include a plurality of transistors and at least one storage capacitor. A channel layer of each transistor included in the stages ST1 to STn may include an oxide semiconductor. Each of the stage ST1 to STn may be substantially rectangular, and all of the stages ST1 to STn may have substantially the same size (area). In other words, the sizes of the regions in the display panel 300 where the plurality of transistors and storage capacitors included in the respective stages ST1 to STn are disposed may be substantially the same, and the areas of the respective stages ST1 to STn may be substantially rectangular. For example, each of the stage ST1 to STn may be disposed with substantially the same rectangular area. In FIG. 1, each of the stages ST1 to STn is shown as a rectangular block having the same area and shape.

Figure 2:
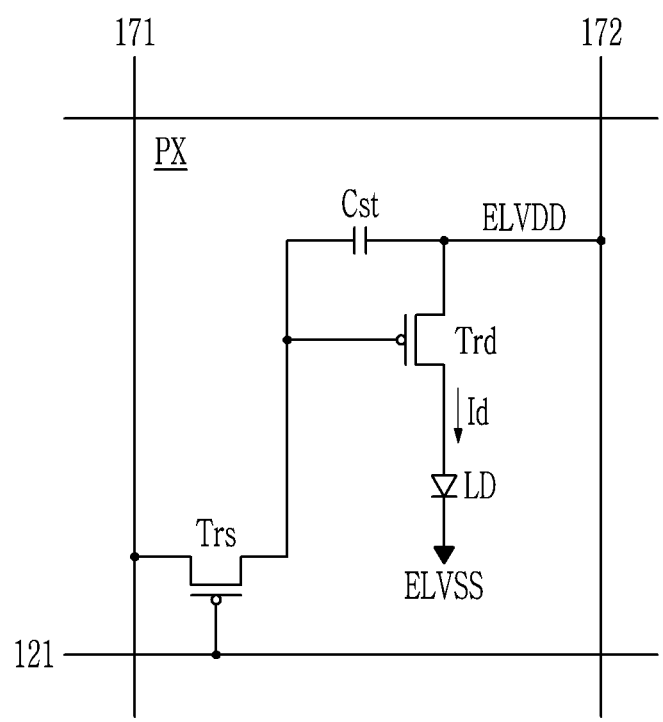
FIG. 2 illustrates an equivalent circuit diagram of a pixel of the display device according to FIG. 1.

FIG. 2 illustrates an equivalent circuit diagram of a pixel of the display device according to FIG. 1.

Referring to FIG. 2, the pixel PX is connected to a plurality of signal lines.

The signal lines include a gate line 121 for transmitting a gate signal, a data line 171 for transmitting a data signal, and a driving voltage line 172 for transmitting a driving voltage ELVDD.

The gate lines 121 extend in a substantially horizontal direction (or a row direction) and are substantially parallel to one another, and the data lines 171 and the driving voltage lines 172 extend in a substantially vertical direction (or a column direction) and are substantially parallel to one another.

The pixel PX includes a switching transistor Trs, a driving transistor Trd, a storage capacitor Cst, and a light emitting diode LD.

The switching transistor Trs has a control terminal, an input terminal, and an output terminal, and the control terminal is connected to the gate line 121, the input terminal is connected to the data line 171, and the output terminal is connected to the driving transistor Trd. The switching transistor Trs transmits the data signal applied to the data line 171 to the driving transistor Trd in response to the gate signal applied to the gate line 121.

The driving transistor Trd also has a control terminal, an input terminal, and an output terminal, and the control terminal is connected to the output terminal of the switching transistor Trs, the input terminal is connected to the driving voltage line 172, and the output terminal is connected to the light-emitting diode LD. A driving current Id may flow through the driving transistor Trd and emit the light-emitting diode LD. The driving current ID may vary according to a voltage applied between the control terminal and the output terminal of the driving transistor Trd.

According to one embodiment, the channel layers of the switching transistor Trs and the driving transistor Trd may include an oxide semiconductor.

The storage capacitor Cst may be connected between the control terminal and the input terminal of the driving transistor Trd. The storage capacitor Cst charges a voltage corresponding to the data signal that is applied to the control terminal of the driving transistor Trd through the switching transistor Trs and maintains the charged voltage even after the switching transistor Trs is turned off.

The light emitting diode LD includes an anode connected to the output terminal of the driving transistor Trd and a cathode connected to a common voltage ELVSS. The light emitting diode LD may emit light with different intensity depending on the output current Id that flows through the driving transistor Trd to display an image.

A connection relationship of the switching transistor Trs, the driving transistor Trd, the storage capacitor Cst, and the light emitting diode LD may be variously changed without deviating from the scope of the present disclosure.

According to one embodiment, the switching transistor Trs and the driving transistor Trd have different structures. In addition, the switching transistors Trs and the transistors included in each of the stages ST1 to STn of the gate driver 500 may have the same structure. The structures of such switching and/or driving transistors will be described with reference to FIG. 3.

Figure 3:
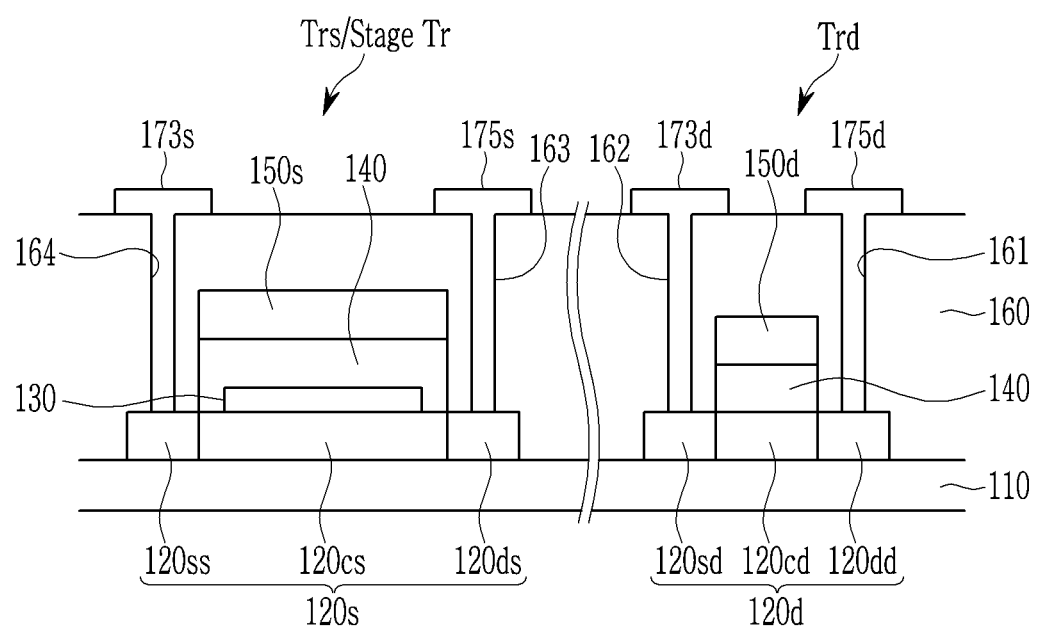
FIG. 3 illustrates an example of a cross-section of a transistor included in the display device according to FIG. 1.

FIG. 3 illustrates an example of a cross-section of a transistor included in the display device according to FIG. 1.

In FIG. 3, "Trs" denotes a switching transistor, and "Stage Tr" denotes a transistor included in each of the stages ST1 to STn of the gate driver 500. "Trd" denotes a driving transistor.

Referring to FIG. 3, the switching transistor Trs and the transistor (Stage Tr) included in each of the stages ST1 to STn of the gate driver 500 include a switching semiconductor layer 120s, a switching channel layer 130, a switching gate electrode 150s, a switching drain electrode 175s, and a switching source electrode 173s. The driving transistor Trd includes a driving semiconductor layer 12d, a driving gate electrode 150d, a driving drain electrode 175d, and a driving source electrode 173d.

The switching semiconductor layer 120s and the driving semiconductor layer 120d are disposed on a substrate 110.

The substrate 110 includes glass or plastic.

The switching semiconductor layer 120s and the driving semiconductor layer 120d may include at least one of an indium gallium zinc oxide (IGZO), an indium zinc oxide (IZO), a hafnium indium zinc oxide (HIZO), and a hafnium zinc oxide (HZO).

The driving semiconductor layer 120d includes a driving source region 120sd, a driving drain region 120dd, and a driving intermediate region 120cd. The driving intermediate region 120cd is disposed between the driving source region 120sd and the driving drain region 120dd. According to one embodiment, the driving intermediate region 120cd may be an oxide semiconductor that is not doped with impurities, and the driving source region 120sd and the driving drain region 120dd may be made as a conductor by hydrogen of an interlayer insulating film 160 described later. Hydrogen of the interlayer insulating film 160 may be diffused into the oxide semiconductor such that a concentration of carriers increases. Here, the driving intermediate region 120cd may correspond to a channel layer of the driving transistor Trd.

The switching semiconductor layer 120s includes a switching source region 120ss, a switching drain region 120ds, and a switching intermediate region 120cs. The switching intermediate region 120cs is disposed between the switching source region 120ss and the switching drain region 120ds. According to one embodiment, the switching intermediate region 120cs may be an oxide semiconductor that is not doped with impurities, and the switching source region 120ss and the switching drain region 120ds may be made as a conductor by hydrogen of the interlayer insulating film 160 described later. Hydrogen of the interlayer insulating film 160 may be diffused into the oxide semiconductor such that a concentration of carriers increases.

The switching channel layer 130 is disposed on the switching semiconductor layer 120s and overlaps at least a portion of the switching intermediate region 120cs. In one embodiment, a width of the switching channel layer 130 may be smaller than that of the switching intermediate region 120cs. In another embodiment, the width of the switching channel layer 130 may be substantially the same as that of the switching intermediate region 120cs. The switching channel layer 130 may be an oxide semiconductor in which impurities are not doped, and include at least one of an indium tin gallium zinc oxide (ITGZO) and an indium tin zinc oxide (ITZO). The switching channel layer 130 may correspond to a channel layer of the switching transistor Trs and the transistor (State Tr) included in each of the stages ST1 to STn of the gate driver 500.

According to one embodiment, the channel layers of the switching transistors Trs and the transistor (Stage Tr) included in each of the stages ST1 to STn of the gate driver 500 and the channel layer of the driving transistor Trd are made of different materials and may have difference structures and placements on the display panel 300.

In one embodiment, the channel layers of the switching transistors Trs and the transistor (Stage Tr) included in each of the stages ST1 to STn of the gate driver 500 include an oxide semiconductor material containing tin, and the channel layer of the driving transistor Trd includes an oxide semiconductor material that does not contain tin. Due to the difference in material composition, mobility of the channel layers of the switching transistors Trs and the transistor (Stage Tr) included in each of the stages ST1 to STn of the gate driver 500 becomes higher than that of the channel layer of the driving transistor Trd.

Due to the increased mobility of the channel layer of the transistor included in each of the stages ST1 to STn, a size of the transistor included in each of the stages ST1 to STn and the number of transistors (Stage Tr) included in the stages ST1 to STn may be reduced. Accordingly, a size of the gate driver 500 may be reduced, thereby reducing a width of the non-display area NDA as well.

As the mobility of the channel layer of the switching transistor Trs increases, stress on a voltage/current applied to the switching transistor Trs may be reduced.

According to one embodiment, the mobility of the channel layer of the driving transistor Trd may be relatively reduced compared to the mobility of the channel layer of the transistor included in each of the stages ST1 to STn. In this case, a driving range of the driving transistor Trd may be widened. This may be advantageous for displaying a gray with high resolution.

In some embodiments, the channel layers of the switching transistor Trs and the transistors included in each of the stages ST1 to STn of the gate driver 500 may be disposed on the switching semiconductor layer 120s and overlap at least a portion of the switching intermediate region 120cs.

A buffer layer may be disposed between the substrate 110 and the switching semiconductor layer 120s, and between the substrate 110 the driving semiconductor layer 120d. The buffer layer may include an inorganic insulating film. The buffer layer may serve to prevent unnecessary components such as impurities or moisture from penetrating, and at the same time, to flatten a surface of the substrate 110.

A gate insulating film 140 may be disposed on the switching channel layer 130 in a region corresponding to the switching transistor Trs and the transistors included in each of the stages ST1 to STn of the gate driver 500 and overlaps at least a portion of the driving intermediate region 120cd in a region corresponding to the driving transistor Trd. The gate insulating film 140 may include at least one of a silicon oxide (SiOx) and a silicon nitride (SiNx).

The driving gate electrode 150d and the switching gate electrode 150s may be disposed on the gate insulating film 140. The driving gate electrode 150d may overlap at least a portion of the driving intermediate region 120cd, and the switching gate electrode 150s may overlap at least a portion of the switching channel layer 130.

The interlayer insulating film 160 may be disposed on the driving source region 120sd, the driving drain region 120dd, the switching source region 120ss, the switching drain region 120ds, the driving gate electrode 150d, and the switching gate electrode 150s. The interlayer insulating film 160 may include a silicon nitride oxide (SiOyNx).

In some embodiments, the interlayer insulating film 160 may include a silicon oxide (SiOx) and a silicon nitride (SiNx). The interlayer insulating film 160 has a larger hydrogen amount or a higher hydrogen concentration in a unit area than that of the gate insulating film 140.

The interlayer insulating film 160 includes a first contact hole 161, a second contact hole 162, a third contact hole 163, and a fourth contact hole 164. The first contact hole 161 overlaps at least a portion of the driving drain region 120dd, and the second contact hole 162 overlaps at least a portion of the driving source region 120sd. The third contact hole 163 overlaps at least a portion of the switching drain region 120ds, and the fourth contact hole 164 overlaps at least a portion of the switching source region 120ss.

The driving drain electrode 175d, the driving source electrode 173d, the switching drain electrode 175s, and the switching source electrode 173s are disposed on the interlayer insulating film 160. The driving drain electrode 175d is connected to the driving drain region 120dd through the first contact hole 161. The driving source electrode 173d is connected to the driving source region 120sd through the second contact hole 162. The switching drain electrode 175s is connected to the switching drain region 120ds through the third contact hole 163. The switching source electrode 173s is connected to the switching source region 120ss through the fourth contact hole 164.

Hereinafter, a manufacturing method of the display device according to the exemplary embodiment of the present disclosure will be described with reference to FIGS. 4 through 13 and FIG. 3.

FIGS. 4 through FIG. 13 illustrate cross-sectional views of a display device during a manufacturing process of the display device according to an exemplary embodiment of the present disclosure.

In FIGS. 4 through FIG. 13, "Trs" denotes a switching transistor, and "Stage Tr" denotes a transistor included in each of the stages ST1 to STn of the gate driver 500. "Trd" denotes a driving transistor.

Figure 4:
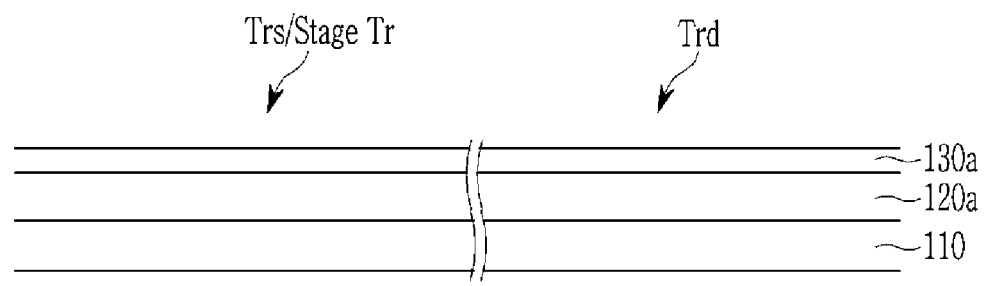
FIGS. 4 through FIG. 13 illustrate cross-sectional views of a display device during a manufacturing process of the display device according to an exemplary embodiment of the present disclosure.

Referring to FIG. 4, a first semiconductor material layer 120a and a second semiconductor material layer 130a are sequentially formed on the substrate 110.

The first semiconductor material layer 120a may include at least one of an indium gallium zinc oxide (IGZO), an indium zinc oxide (IZO), a hafnium indium zinc oxide (HIZO), and a hafnium zinc oxide (HZO). The second semiconductor material layer 130a may include at least one of an indium tin gallium zinc oxide (ITGZO) and an indium tin zinc oxide (ITZO).

The first semiconductor material layer 120a and the second semiconductor material layer 130a are different from each other in their material composition. In one embodiment, the first semiconductor material layer 120a may include an oxide semiconductor material containing no tin, and the second semiconductor material layer 130a may include an oxide semiconductor material containing tin.

Figure 5:
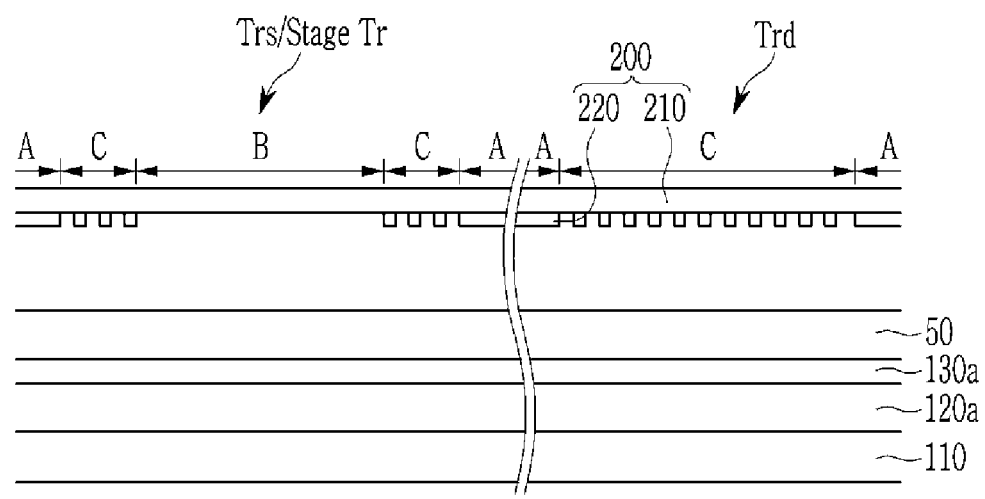

Referring to FIG. 5, a first photoresist film 50 is formed on the second semiconductor material layer 130a, and then the first photoresist film 50 is exposed using a mask 200.

The mask 200 includes a transparent substrate 210 and a light blocking film 220. The mask 200 further includes a light blocking region A, a transmissive region B, and a semi-transmissive region C. The light blocking region A corresponds to a region where the light blocking film 220 that completely blocks light is disposed. The transmissive region B corresponds to a region where the light blocking film 220 is not present, and light is transmitted therethrough. The semi-transmissive region C corresponds to a region where a plurality of light blocking films 220 are disposed at intervals, and a smaller amount of light than the amount of light transmitted through the transmissive region B is transmitted therethrough. The transmissive region B may be disposed only in a region where the switching transistors Trs and the transistor (Stage Tr) included in each of the stages ST1 to STn of the gate driver 500 are formed. In this case, the mask 200 may also be referred to as a half-tone mask or a slit mask.

Figure 6:
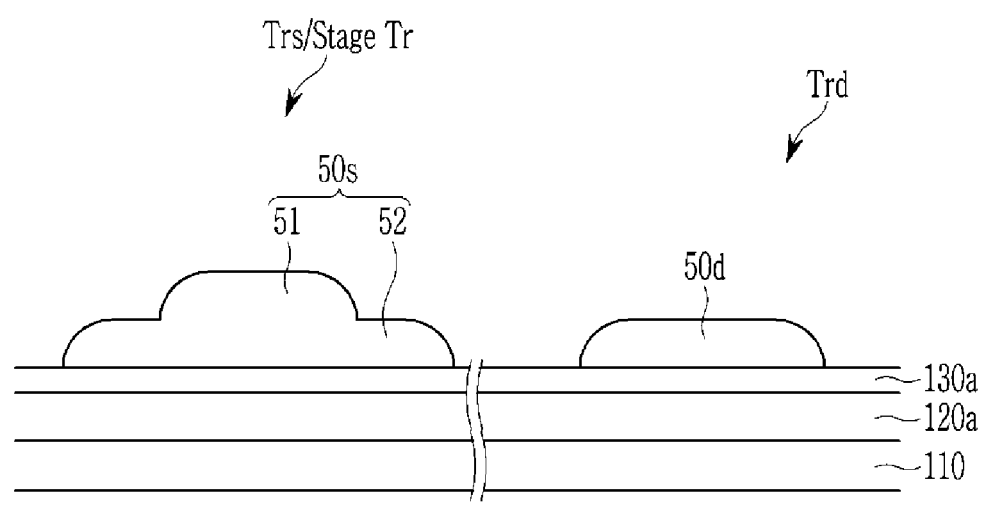

Referring to FIG. 6, the exposed portion of the first photoresist film 50 is developed to form a second photoresist film 50s and a third photoresist film 50d. The second photoresist film 50s is disposed in the region where the switching transistor Trs and the transistor (Stage Tr) included in each of the stages ST1 to STn of the gate driver 500 are formed, and the third photoresist film 50d is disposed in the region where the driving transistor Trd is formed.

The second photoresist film 50s includes a first portion 51 and a second portion 52 that is thinner than the first portion. The first portion 51 is exposed by the transmissive region B of the mask 200, and the second portion 52 is exposed by the semi-transmissive region C of the mask 200. A thickness of the third photoresist film 50d may be equal to that of the second portion 52 of the second photoresist film 50s. The third photoresist film 50*d* is exposed by the semi-transmissive region C of the mask 200.

Figure 7:
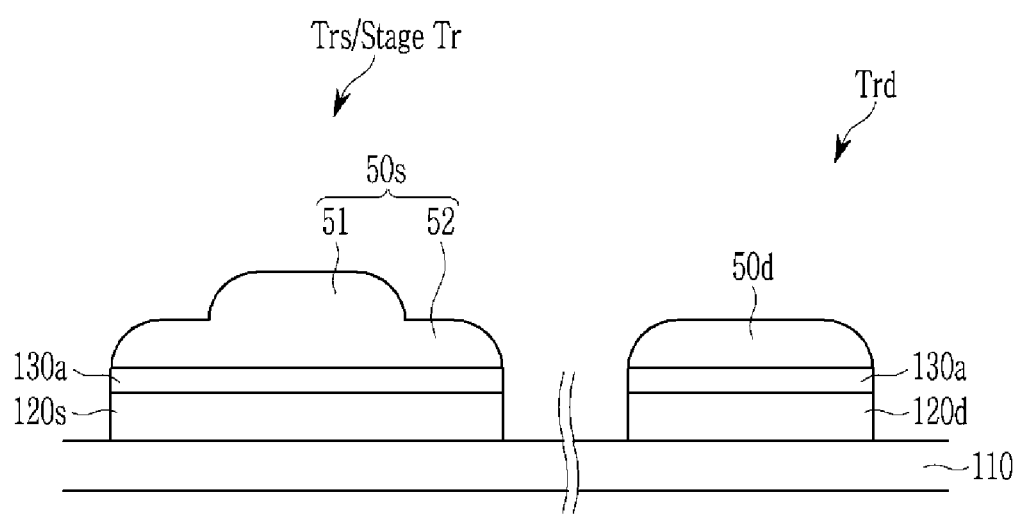

Referring to FIG. 7, a first etching process is performed to etch the first semiconductor material layer 120*a* and the second semiconductor material layer 130*a*. The switching semiconductor layer 120*s* and the driving semiconductor layer 120*d* are formed by etching the first semiconductor material layer 120*a*. The switching semiconductor layer 120*s* is disposed in the region where the switching transistor Trs and the transistor (Stage Tr) included in each of the stages ST1 to STn of the gate driver 500 are formed, and the driving semiconductor layer 120*d* is disposed in the region where the driving transistor Trd is formed.

The first etching process in which the first semiconductor material layer 120*a* and the second semiconductor material layer 130*a* are etched using the second photoresist film 50*s* and the third photoresist film 50*d* as masks may include a wet etching process.

Figure 8:
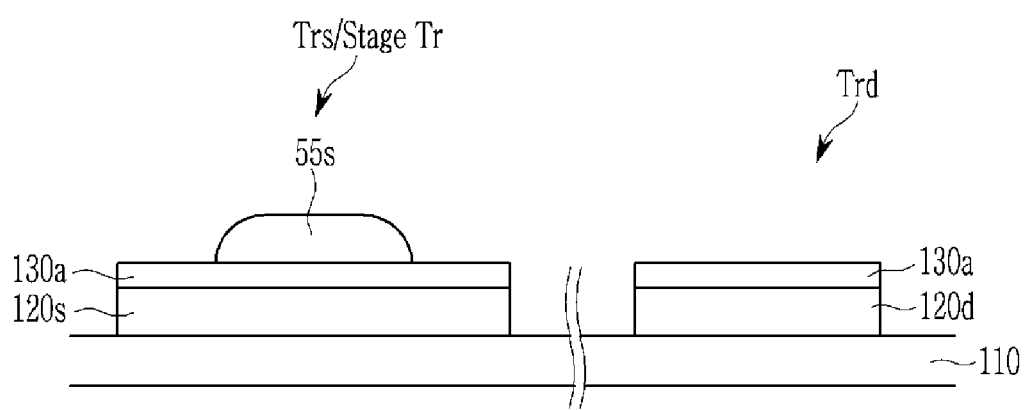

Referring to FIG. 8, a fourth photoresist film 55*s* is formed by ashing the second photoresist film 50*s* and the third photoresist film 50*d*.

When the second photoresist film 50*s* and the third photoresist film 50*d* are ashed, the second portion 52 of the second photoresist film 50*s* and the third photoresist film 50*d* may be removed, and the first portion 51 of the second photoresist film 50*s* may become thin, thereby forming the fourth photoresist film 55*s*.

Figure 9:
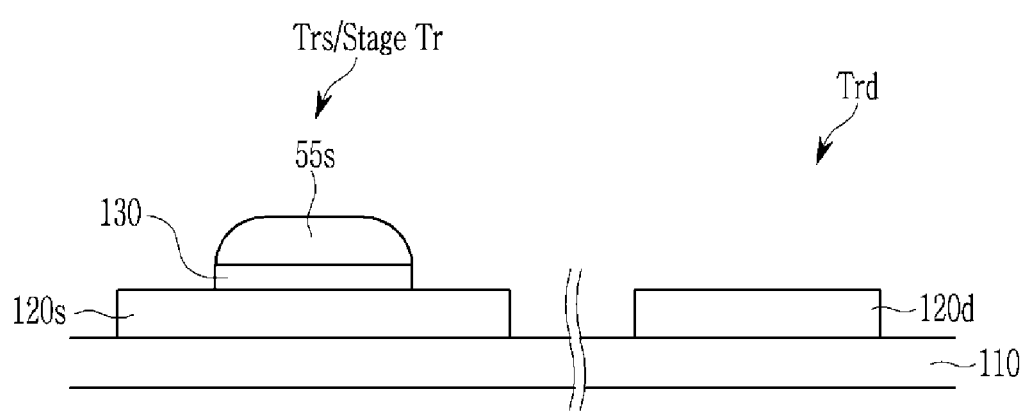

Referring to FIG. 9, a second etching process is performed to form the switching channel layer 130. The switching channel layer 130 is disposed in a region where the switching transistors Trs and the transistor (Stage Tr) included in each of the stages ST1 to STn of the gate driver 500 are formed.

The second etching process in which the second semiconductor material layer 130*a* is etched using the fourth photoresist film 55*s* as a mask may include a dry etching process. In the second etching process, an etching gas containing fluorine (F) such as $SF_6$, $CF_4$, $CHF_3$, $CHF_5$, and $C_4F_8$ may be used. The etching gas has etch selectivity for the second semiconductor material layer 130*a* that contains tin and the first semiconductor material layer 120*a* that does not contain tin. That is, since the etching gas containing the fluorine easily reacts with tin, the second etching process of the second semiconductor material layer 130*a* may be rapidly performed, and the portion of the second semiconductor material layer 130*a* other than the portion of the second semiconductor material layer 130*a* that overlaps the fourth photoresist film 55*s* may be etched.

Accordingly, the switching semiconductor layer 120*s*, the driving semiconductor layer 120*d*, and the switching channel layer 130 may be formed by a single masking process. Thus, the number of masking processes for manufacturing the display device may be reduced.

Figure 10:
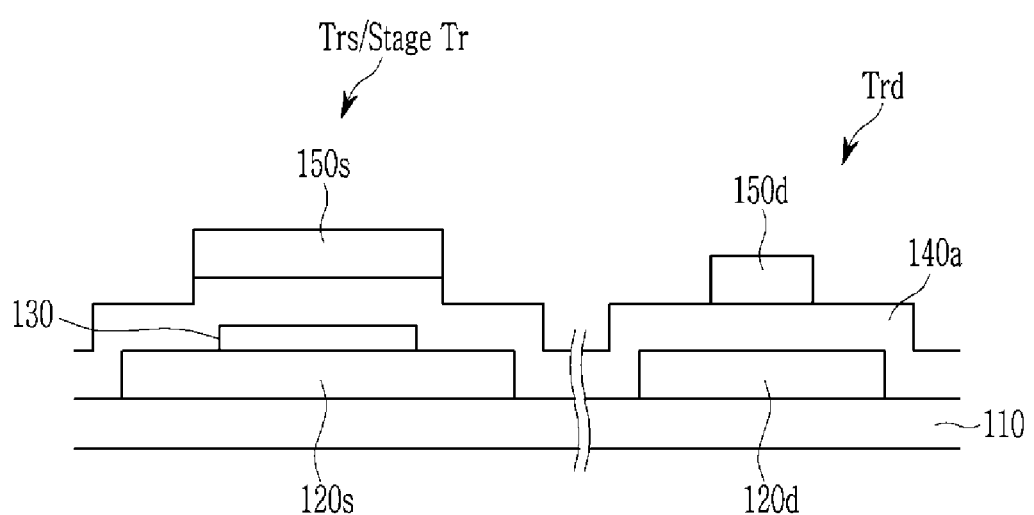

Referring to FIG. 10, after the fourth photoresist film 55*s* is removed, a gate insulating film material layer 140*a* is formed on the substrate 110, the switching semiconductor layer 120*s*, the driving semiconductor layer 120*d*, and the switching channel layer 130, and then the switching gate electrode 150*s* and the driving gate electrode 150*d* are formed on the gate insulating film material layer 140*a*. The gate insulating film material layer 140*a* may include at least one of a silicon oxide (SiOx) and a silicon nitride (SiNx). The switching gate electrode 150*s* may overlap at least a portion of the switching channel layer 130, and the driving gate electrode 150*d* may overlap at least a portion of the driving semiconductor layer 120*d*.

Figure 11:
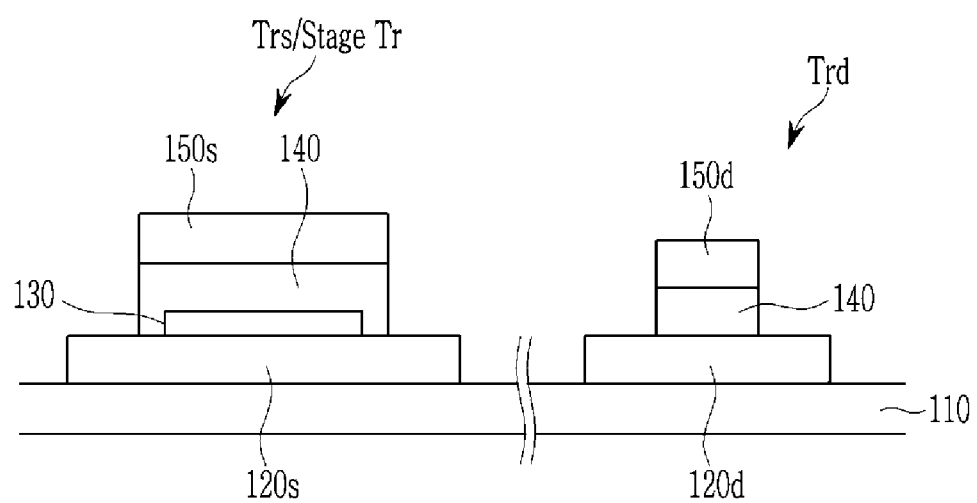

Referring to FIG. 11, the gate insulating film material layer 140*a* is etched using the switching gate electrode 150*s* and the driving gate electrode 150*d* as masks to form the gate insulating film 140.

Figure 12:
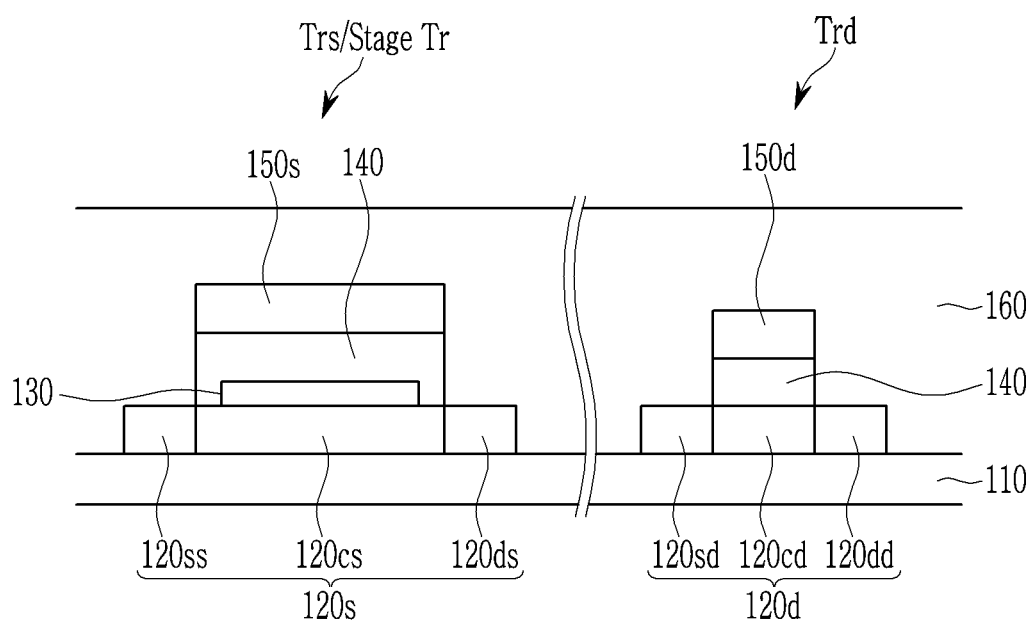

Referring to FIG. 12, the interlayer insulating film 160 is formed on the switching semiconductor layer 120*s*, the driving semiconductor layer 120*d*, the switching gate electrode 150*s*, and the driving gate electrode 150*d*. The interlayer insulating film 160 may include a silicon oxynitride (SiOyNx). In some embodiments, the interlayer insulating film 160 may include a silicon oxide (SiOx) and a silicon nitride (SiNx). The interlayer insulating film 160 may have a larger hydrogen amount or a higher hydrogen concentration in a unit area than that of the gate insulating film 140.

When the interlayer insulating film 160 is formed, a heat treatment process may be performed, and in this case, hydrogen (H) included in the interlayer insulating film 160 may be diffused into the switching semiconductor layer 120*s* and the driving semiconductor layer 120*d*. A carrier concentration of a portion of the switching semiconductor layer 120*s* increases due to the hydrogen diffused from the interlayer insulating film 160, thus the portions of the switching semiconductor layer 120*s* that are hydrogen diffused may have a property of a conductor appropriate to serve as the switching source region 120*ss* and the switching drain region 120*ds*. In addition, a carrier concentration of a portion of the driving semiconductor layer 120*d* increases due to the hydrogen diffused from the interlayer insulating film 160, thus the portions of the driving semiconductor layer 120*d* that are hydrogen diffused may have a property of a conductor appropriate to serve as the driving source region 120*sd* and the driving drain region 120*dd*.

After completing the heat treatment process, the switching semiconductor layer 120*s* includes the switching source region 120*ss*, the switching drain region 120*ds*, and the switching intermediate region 120*cs*, and the driving semiconductor layer 120*d* includes the driving source region 120*sd*, the driving drain region 120*dd*, and the driving intermediate region 120*cd*.

Figure 13:
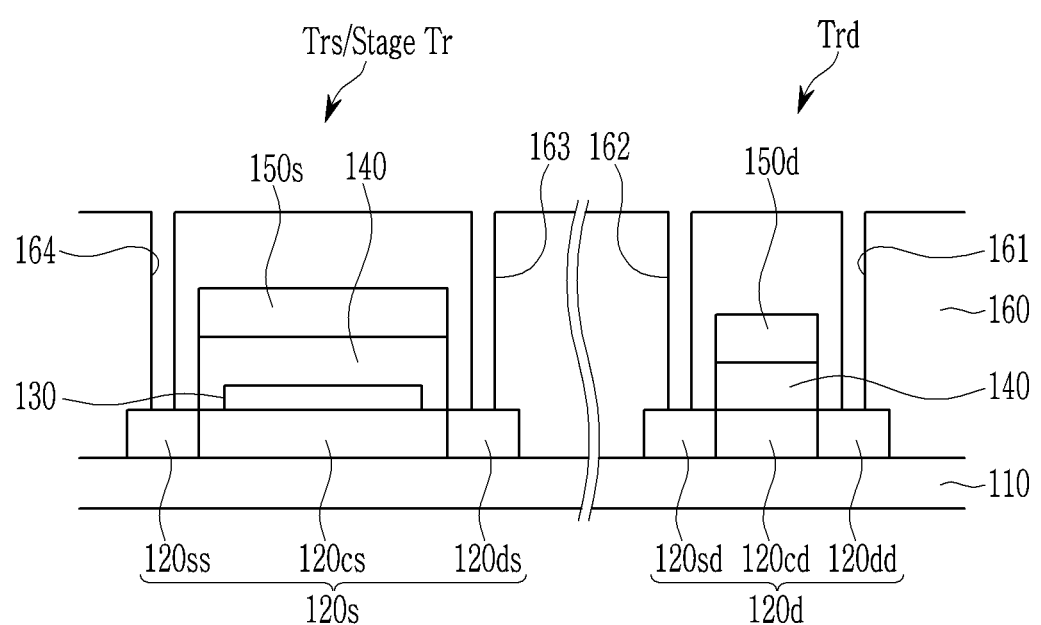

Referring to FIG. 13, the first contact hole 161, the second contact hole 162, the third contact hole 163, and the fourth contact hole 164 are formed in the interlayer insulating film 160. The first contact hole 161 may overlap at least a portion of the driving drain region 120*dd*, and the second contact hole 162 may overlap at least a portion of the driving source region 120*sd*. The third contact hole 163 may overlap at least a portion of the switching drain region 120*ds*, and the fourth contact hole 164 may overlaps at least a portion of the switching source region 120*ss*.

Referring back to FIG. 3, the driving drain electrode 175*d*, the driving source electrode 173*d*, the switching drain electrode 175*s*, and the switching source electrode 173*s* are formed on the interlayer insulating film 160. The driving drain electrode 175*d* is connected to the driving drain region 120*dd* through the first contact hole 161. The driving source electrode 173*d* is connected to the driving source region 120*sd* through the second contact hole 162. The switching drain electrode 175*s* is connected to the switching drain region 120*ds* through the third contact hole 163. The switching source electrode 173*s* is connected to the switching source region 120*ss* through the fourth contact hole 164.

Thereafter, the light emitting diode LD that is connected to the driving transistor Trd may be formed (see FIG. 2).

On the other hand, a structure of the pixel may be variously formed without deviating from the scope of the present disclosure.

Figure 14:
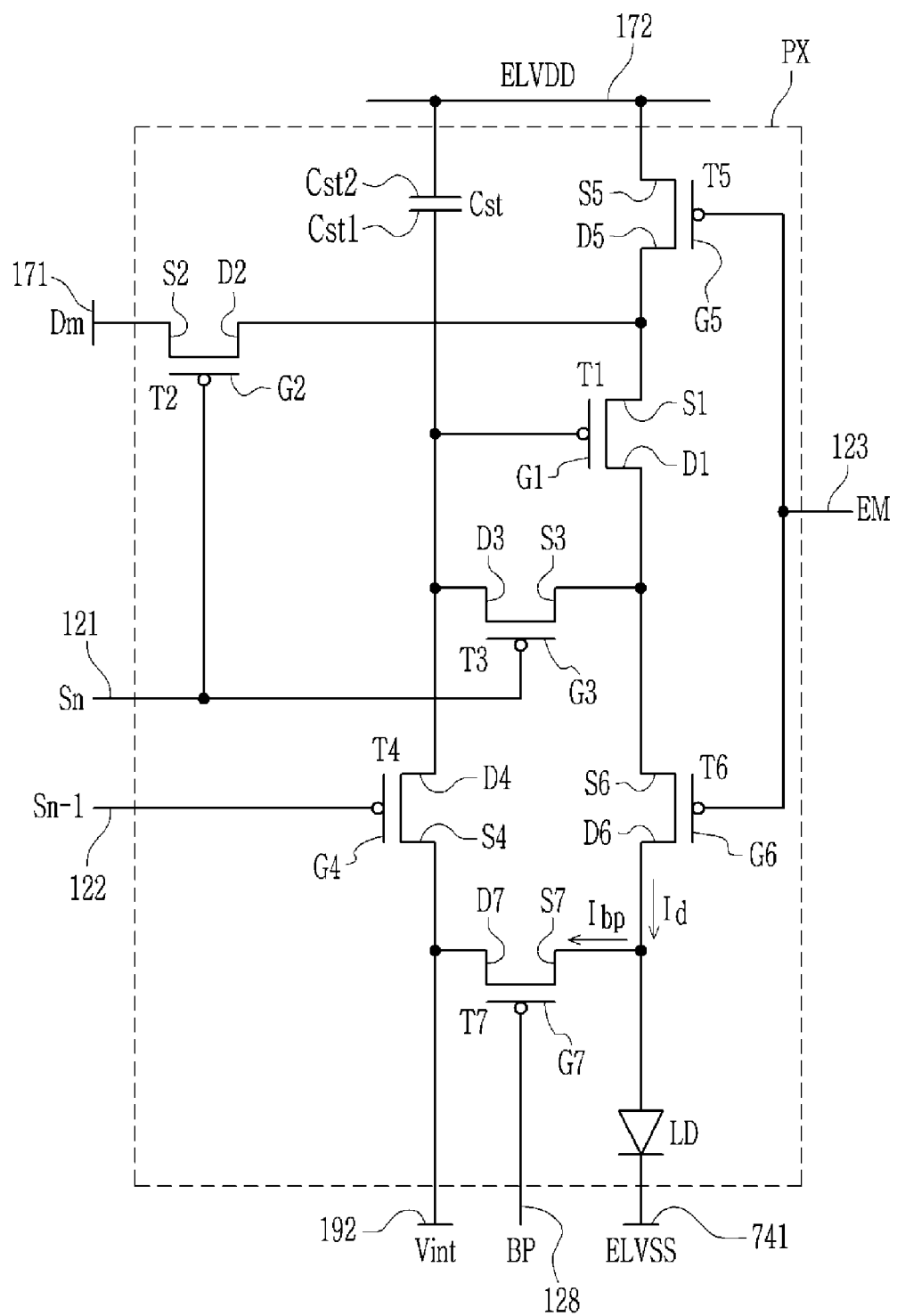
FIG. 14 illustrates an equivalent circuit diagram of a pixel of a display device according to an exemplary embodiment of the present disclosure.

FIG. 14 illustrates an equivalent circuit diagram of a pixel of a display device according to an exemplary embodiment of the present disclosure.

Referring to FIG. 14, the pixel PX includes a plurality of transistors that is connected to a plurality of signal lines.

The transistors includes a driving transistor T1, a switching transistor T2, a compensating transistor T3, an initializing transistor T4, an operation control transistor T5, a light emission control transistor T6, and a bypass transistor T7.

The signal lines include the gate line 121 for transmitting a scan signal Sn, a previous gate line 122 for transferring a previous scan signal Sn-1 to the initializing transistor T4, a light emission control line 123 for transmitting a light emission control signal EM to the operation control transistor T5 and the light emission control transistor T6, a bypass control line 128 for transmitting a bypass signal BP to the bypass transistor T7, the data line 171 that crosses the gate line 121 and transmits a data signal Dm, the driving voltage line 172 that transmits the driving voltage ELVDD and is formed to be substantially parallel to the data line 171, and an initializing voltage line 192 for transmitting an initializing voltage Vint for initializing the driving transistor T1.

The pixel PX further includes a storage capacitor Cst and an organic light emitting diode OLED.

Here, a structure of the driving transistor T1 may be the same as that of the driving transistor Trd shown in FIG. 3. Structures of the switching transistor T2, the compensating transistor T3, the initializing transistor T4, the operation control transistor T5, the light emission control transistor T6, and the bypass transistor T7 may be the same as that of the switching transistor Trs shown in FIG. 3.

A gate electrode G1 of the driving transistor T1 is connected to one end Cst1 of the storage capacitor Cst, a source electrode S1 of the driving transistor T1 is connected to the driving voltage line 172 via the operation control transistor T5, and a drain electrode D1 of driving transistor T1 is electrically connected to the anode of the light emitting diode LD via the emission control transistor T6. The driving transistor T1 receives a data signal Dm in accordance with a switching operation of the switching transistor T2 and supplies a driving current Id to the light emitting diode LD.

A gate electrode G2 of the switching transistor T2 is connected to the gate line 121, a source electrode S2 of the switching transistor T2 is connected to the data line 171, and a drain electrode D2 of the switching transistor T2 is connected to the source electrode S1 of the driving transistor T1 and is also connected to the driving voltage line 172 via the operation control transistor T5. The switching transistor T2 is turned on in response to the scan signal Sn transmitted through the gate line 121 to perform a switching operation to transmit the data signal Dm that is received through the data line 171 to the source electrode of the driving transistor T1.

A gate electrode G3 of the compensating transistor T3 is connected to the gate line 121, a source electrode S3 of the compensating transistor T3 is connected to the drain electrode D1 of the driving transistor T1 and is also connected to the anode of the light emitting diode LD via the emission control transistor T6, and a drain electrode D3 of the compensating transistor T3 is connected to a drain electrode D4 of the initializing transistor T4, the one end Cst1 of the storage capacitor Cst, and the gate electrode G1 of the driving transistor T1. The compensating transistor T3 is turned on according to the scan signal Sn transmitted through the gate line 121 to connect the gate electrode G1 and the drain electrode D1 of the driving transistor T1 to each other to diode-connect the driving transistor T1.

A gate electrode G4 of the initializing transistor T4 is connected to the previous gate line 122, a source electrode S4 of the initializing transistor T4 is connected to the initializing voltage line 192, and the drain electrode D4 of the initializing transistor T4 is connected to the one end Cst1 of the storage capacitor Cst, the gate electrode G1 of the driving transistor T1, and the drain electrode D3 of the compensating transistor T3. The initializing transistor T4 is turned on according to the previous scan signal Sn-1 that is received through the previous gate line 122 to transmit the initializing voltage Vint to the gate electrode G1 of the driving transistor T1 to perform an initializing operation to initialize the gate voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the emission control transistor T6 is connected to the light emission control line 123, a source electrode S6 of the emission control transistor T6 is connected to the drain electrode D1 of the driving transistor T1 and the source electrode S3 of the compensating transistor T3, and a drain electrode D6 of the emission control transistor T6 is electrically connected to the anode of the light emitting diode LD. The operation control transistor T5 and the emission control transistor T6 are simultaneously turned on according to the light emission control signal EM received through the light emission control line 123, and the driving voltage ELVDD is compensated through the diode-connection of the driving transistor T1 and then is transmitted to the light emitting diode LD.

A gate electrode G7 of the bypass transistor T7 is connected to the bypass control line 128, a source electrode S7 of the bypass transistor T7 is connected to the drain electrode D6 of the emission control transistor T6 and the anode of the light emitting diode LD, and a drain electrode D7 of the bypass transistor T7 is connected to the initializing voltage line 192 and the source electrode S4 of the initializing transistor T4. In a state where the bypass transistor T7 is turned off, a bypass current Ibp that is a portion of the driving current Id flows through the bypass transistor T7.

Another end Cst2 of the storage capacitor Cst is connected to the driving voltage line 172, and the cathode of the light emitting diode LD is connected to a common voltage line 741 for transmitting the common voltage ELVSS.

While the present disclosure has been described in connection with what is presently considered to be exemplary embodiments, it is to be understood that the present disclosure is not limited to the disclosed exemplary embodiments, but, on the contrary, is intended to cover various modifications and equivalent arrangements included within the spirit and scope of the present disclosure.

<Description of symbols>

| | |
|---|---|
| 120a: first semiconductor material layer | |
| 120d: driving semiconductor layer | 120s: switching semiconductor layer |
| 121: gate line | |
| 120cd: driving intermediate region | 120cs: switching intermediate region |
| 120sd: driving source region | 120ss: switching source region |
| 123: light emission control line | |
| 120dd: driving drain region | 120ds: switching drain region |

<Description of symbols>

130: switching channel layer
130a: second semiconductor material layer
150d: driving gate electrode
150s: switching gate electrode
171: data line
175d: driving drain electrode
175s: switching drain electrode
172: driving voltage line
173d: driving source electrode
173s: switching source electrode
200: mask

What is claimed is:

1. A display device comprising:
a substrate including a display area and a non-display area;
a gate driver disposed on the substrate in the non-display area and including a plurality of stages that generates a gate signal and outputs the gate signal to the display area;
a switching transistor and a driving transistor disposed on the substrate in the display area; and
a light emitting diode connected to the driving transistor,
wherein each of the plurality of stages includes a plurality of transistors,
wherein a channel layer of the driving transistor includes a first oxide semiconductor material, and a channel layer of the plurality of transistors included in each of the plurality of stages includes a second oxide semiconductor material,
wherein the first oxide semiconductor material is different from the second oxide semiconductor material, and
wherein the second oxide semiconductor material includes tin.

2. The display device of claim 1, wherein the channel layer of the switching transistor include the second oxide semiconductor material.

3. The display device of claim 2, wherein the channel layer of the plurality of transistors included in each of the plurality of stages and the channel layer of the driving transistor are disposed on different layers.

4. The display device of claim 3, wherein the channel layer of the switching transistor and the channel layer of the plurality of transistors included in each of the plurality of stages are disposed on the same layer.

5. The display device of claim 4, wherein each of the plurality of transistors included in each of the plurality of stages and the switching transistor includes:
a switching semiconductor layer disposed on the substrate and including a switching source region, a switching drain region, and a switching intermediate region disposed between the switching source region and the switching drain region;
a switching channel layer disposed on the switching semiconductor layer;
a gate insulating film disposed on the switching channel layer;
a switching gate electrode disposed on the gate insulating film and overlapping at least a portion of the switching channel layer;
a switching source electrode connected to the switching source region; and
a switching drain electrode connected to the switching drain region, and
wherein the switching channel layer overlaps at least a portion of the switching intermediate region of the switching semiconductor layer.

6. The display device of claim 5, wherein each of the channel layer of the plurality of transistors included in the plurality of stages and the channel layer of the switching transistor includes the switching channel layer.

7. The display device of claim 6, wherein the driving transistor includes:
a driving semiconductor layer disposed on the substrate and including a driving source region, a driving drain region, and a driving intermediate region disposed between the driving source region and the driving drain region;
the gate insulating film disposed on the driving intermediate region;
a driving gate electrode disposed on the gate insulating film and overlapping at least a portion of the driving intermediate region;
a driving source electrode connected to the driving source region; and
a driving drain electrode connected to the driving drain region.

8. The display device of claim 7, wherein the channel layer of the driving transistor includes the driving intermediate region.

9. The display device of claim 8, wherein the switching intermediate region and the driving intermediate region include a same material.

10. A method of manufacturing a display device, wherein the display device includes a substrate including a display area and a non-display area, a gate driver disposed on the substrate in the non-display area and including a plurality of stages that generates a gate signal and outputs the gate signal to the display area, a switching transistor and a driving transistor disposed on the substrate in the display area, and a light emitting diode connected to the driving transistor,
wherein the method includes:
sequentially forming a first semiconductor material layer and a second semiconductor material layer on the substrate;
forming a switching semiconductor layer and a driving semiconductor layer by etching the first semiconductor material layer;
forming a switching channel layer that overlaps at least a portion of the switching semiconductor layer by etching the second semiconductor material layer;
forming a gate insulating film material layer on the substrate, the switching semiconductor layer, the driving semiconductor layer, and the switching channel layer;
forming a switching gate electrode that overlaps at least a portion of the switching channel layer and a driving gate electrode that overlaps at least a portion of the driving semiconductor layer on the gate insulating film material layer;
forming a gate insulating film by etching the gate insulating film material layer using the switching gate electrode and the driving gate electrode as masks;
forming an interlayer insulating film on the switching semiconductor layer, the driving semiconductor layer, the switching gate electrode, and the driving gate electrode;
forming a switching source electrode, a switching drain electrode, a driving source electrode, and a driving drain electrode on the interlayer insulating film; and forming a light emitting diode connected to the driving drain electrode, wherein the first semiconductor material layer includes a first oxide semiconductor material, and the second semiconductor material layer include a second oxide semiconductor material, wherein the first oxide semiconductor material is different from the second oxide semiconductor material, and wherein the second semiconductor material layer includes tin.

11. The method of claim 10, wherein the forming of the switching semiconductor layer and the driving semiconductor layer and the forming of the switching channel layer include:

forming a first photoresist film on the second semiconductor material layer;

forming a second photoresist film and a third photoresist film by exposing and developing the first photoresist film using a first mask;

etching the first semiconductor material layer and the second semiconductor material layer by a first etching process;

forming a fourth photoresist film by ashing the second photoresist film and the third photoresist film;

etching the second semiconductor material layer by a second etching process; and removing the fourth photoresist film.

12. The method of claim 11, wherein the first mask includes a light blocking region, a transmissive region, and a semi-transmissive region.

13. The method of claim 12, wherein the first etching process includes etching the first semiconductor material layer and the second semiconductor material layer using the second photoresist film and the third photoresist film as masks, and wherein the switching semiconductor layer and the driving semiconductor layer are formed by etching the first semiconductor material layer.

14. The method of claim 13, wherein, in the forming of the fourth photoresist film, the third photoresist film is removed and a portion of the second photoresist film is removed.

15. The method of claim 14, wherein, in the second etching process, the second semiconductor material layer is etched using the fourth photoresist film as a second mask to form the switching channel layer.

16. The method of claim 15, wherein the forming of the interlayer insulating film includes:

performing heat treatment to diffuse hydrogen of the interlayer insulating film into the switching semiconductor layer and the driving semiconductor layer.

17. The method of claim 16, wherein each of the plurality of stages includes a plurality of transistors, and wherein the plurality of transistors included in each of the plurality of stages and the switching transistor have a same structure.

18. The method of claim 17, wherein the switching transistor includes the switching semiconductor layer, the switching channel layer, the switching gate electrode, the switching source electrode, and the switching drain electrode, and wherein the driving transistor includes the driving semiconductor layer, the driving gate electrode, the driving source electrode, and the driving drain electrode.

19. The method of claim 18, wherein the channel layer of the switching transistor includes the switching channel layer.

20. The method of claim 19, wherein the switching semiconductor layer includes a switching intermediate region that overlaps at least a portion of the switching channel layer, wherein the driving semiconductor layer includes a driving intermediate region that overlaps at least a portion of the driving gate electrode, and wherein the channel layer of the driving transistor includes the driving intermediate region.

\* \* \* \* \*